United States Patent [19]
Miyakawa et al.

[11] Patent Number: 5,917,750
[45] Date of Patent: Jun. 29, 1999

[54] NONVOLATILE SEMICONDUCTOR MEMORY WITH A PROTECT CIRCUIT

[75] Inventors: Tadashi Miyakawa, Yokohama; Nobuaki Ohtsuka, Kawasaki, both of Japan

[73] Assignee: Kabushiki Kaisha Toshiba, Kawasaki, Japan

[21] Appl. No.: 08/955,288

[22] Filed: Oct. 21, 1997

[30]     Foreign Application Priority Data

Oct. 21, 1996  [JP]  Japan .................................. 8-278016

[51] Int. Cl.⁶ .................................................. G11C 11/34
[52] U.S. Cl. .............................. 365/185.04; 365/185.29; 365/201
[58] Field of Search ..................... 365/185.04, 185.29, 365/201

[56]             References Cited

U.S. PATENT DOCUMENTS

| | | | |
|---|---|---|---|
| 5,084,843 | 1/1992 | Mitsuishi et al. ...................... | 365/218 |
| 5,381,369 | 1/1995 | Kikuchi et al. ..................... | 365/185.04 |
| 5,553,026 | 9/1996 | Nakai et al. ............................. | 365/201 |

*Primary Examiner*—David Nelms
*Assistant Examiner*—Hoai V. Ho
*Attorney, Agent, or Firm*—Banner & Witcoff, Ltd.

[57]               ABSTRACT

A plurality of erase circuits are provided for the blocks BLK(0) to BLK(n), each for one block. Protect circuits are connected to the erase circuits, respectively. The protects circuits generate protect signals PROT0 to PROTn, respectively. Each protect signal indicates whether the protect circuit is set in protect mode or not. Each erase circuit receives the protect signal from the protect circuit connected to it. A unit provided in the erase circuit determines, from the protect signal, whether the protect circuit is set in the protect mode. The unit changes the voltage applied to the sources of the memory cells of the cell block connected to the erase circuit, in accordance with whether the protect circuit is set in the protect mode or not. When a voltage is applied to the sources of the memory cells, a data item of a logic value is read from each memory cell. When a different voltage is applied to the sources of the memory cells, a data item of the other logic value is read from each memory cell. Hence, whether or not the protect circuits are set in protect mode can be determined, without erasing or writing data in the block of the memory cell array.

38 Claims, 6 Drawing Sheets

NONVOLATILE SEMICONDUCTOR MEMORY WITH A PROTECT CIRCUIT

BACKGROUND OF THE INVENTION

The present invention relates to a nonvolatile semiconductor memory in which data can be rewritten in units of blocks (or sectors) of the memory cell array.

A flash EEPROM, for example, has a memory cell array (e.g., a 4-MB array or a 16-MB array). The data stored in the memory cell array can be rewritten (that is, data is erased or written), either at a time or in units of block (each block capable of storing 32 kilobits, 64 kilobits or 256 kilobits).

To protect the data stored in the blocks of the memory cell array, one protect circuit is provided for each block. As long as the protect circuit remains in protect mode, it prevents the rewriting of data in the memory cells constituting the block.

The flash EEPROM is set in test mode in order to determine whether or not the protect circuit has been reliably set in the protect mode. In the test mode, it is tried to erase or write data in the memory cells forming each block. If the data is erased or written in the block, the protect circuit is found not set in the protect mode. If the data is neither erased nor written, the protect circuit is proved to perform its function.

A long time is required to test each protect circuit, because two steps of operation must be performed. First, it is necessary to attempt to erase or write data in the block. Then it is necessary to read data from the block to see whether or not the protect circuit has been reliably set in the protect mode. It takes about 1.0 sec to erase the data in one block, and about 0.5 to 0.7 sec to write data in one block.

Thus, in a conventional nonvolatile semiconductor memory, it is first tried to erase or write data in each memory block and then data is read from the block, thereby determining whether or not the protect circuit provided for the block has been set in the protect mode. Any protect circuit that has prevented the rewriting of data in the associated block is regarded as a good one. However, a long time is required to test each protect circuit, because it takes much time to erase or write data in each block. This inevitably increases the manufacturing cost of the nonvolatile semiconductor memory.

BRIEF SUMMARY OF THE INVENTION

In view of the foregoing, the object of this invention is to provide a nonvolatile semiconductor memory which can be tested to determine whether or not the protect circuits are set in protect mode, without erasing or writing data in each of blocks of the memory cell array.

According to a first aspect of the invention there is provided a nonvolatile semiconductor memory which comprises: a memory cell array having a plurality of memory cells each of which has a source; a protect circuit for generating a protect signal representing whether data stored in the memory cells is protected; data-reading means for reading the data from the memory cells; and test means for determining whether the data stored in the memory cells is protected, from the protect signal, while the memory remains in a test mode, and changing a voltage applied to the sources of the memory cells, thereby altering data to be read from the memory cells in accordance with whether the data stored in the memory cells is protected.

The semiconductor memory according to the first aspect may further comprise: an erase circuit for applying an erase voltage to the sources of the memory cells, thereby erasing the data stored in the memory cells, while the memory remains in an erase mode; and a control circuit for generating a test signal, thereby switching an operating mode between the test mode and the erase mode.

According to a second aspect of the present invention there is provided a nonvolatile semiconductor memory which comprises: a memory cell array having word lines, bit lines and source lines and divided into a plurality of blocks each having a plurality of memory cells; a plurality of protect circuits, each provided for one block and designed to generate a protect signal representing whether data stored in the memory cells is protected; data-reading means for reading the data from the memory cells of each block; and test means for determining whether the data stored in the memory cells of each block is protected, from the protect signal, while the memory remains in a test mode, and changing a voltage applied to the sources of the memory cells of each block, thereby altering data to be read from the memory cells of each block in accordance with whether the data stored in the memory cells is protected.

The semiconductor according to the second aspect may further comprise: a plurality of erase circuits, each provided for one block and designed to apply an erase voltage to the sources of the memory cells of the block, thereby erasing the data stored in the memory cells of the block, while the memory remains in an erase mode; and a control circuit for generating a test signal, thereby switching an operating mode between the test mode and the erase mode.

The memory cell array is divided into a plurality of blocks, along lines extending parallel to the word lines. Alternatively, the memory cell array may be divided into a plurality of blocks, along lines extending parallel to the bit lines or the source lines.

In either type of the nonvolatile semiconductor memory, data is erased in the memory cells when the memory is set in the test mode.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Nonvolatile semiconductor memories according to the present invention will be described in detail, with reference to the accompanying drawings.

Figure 1:
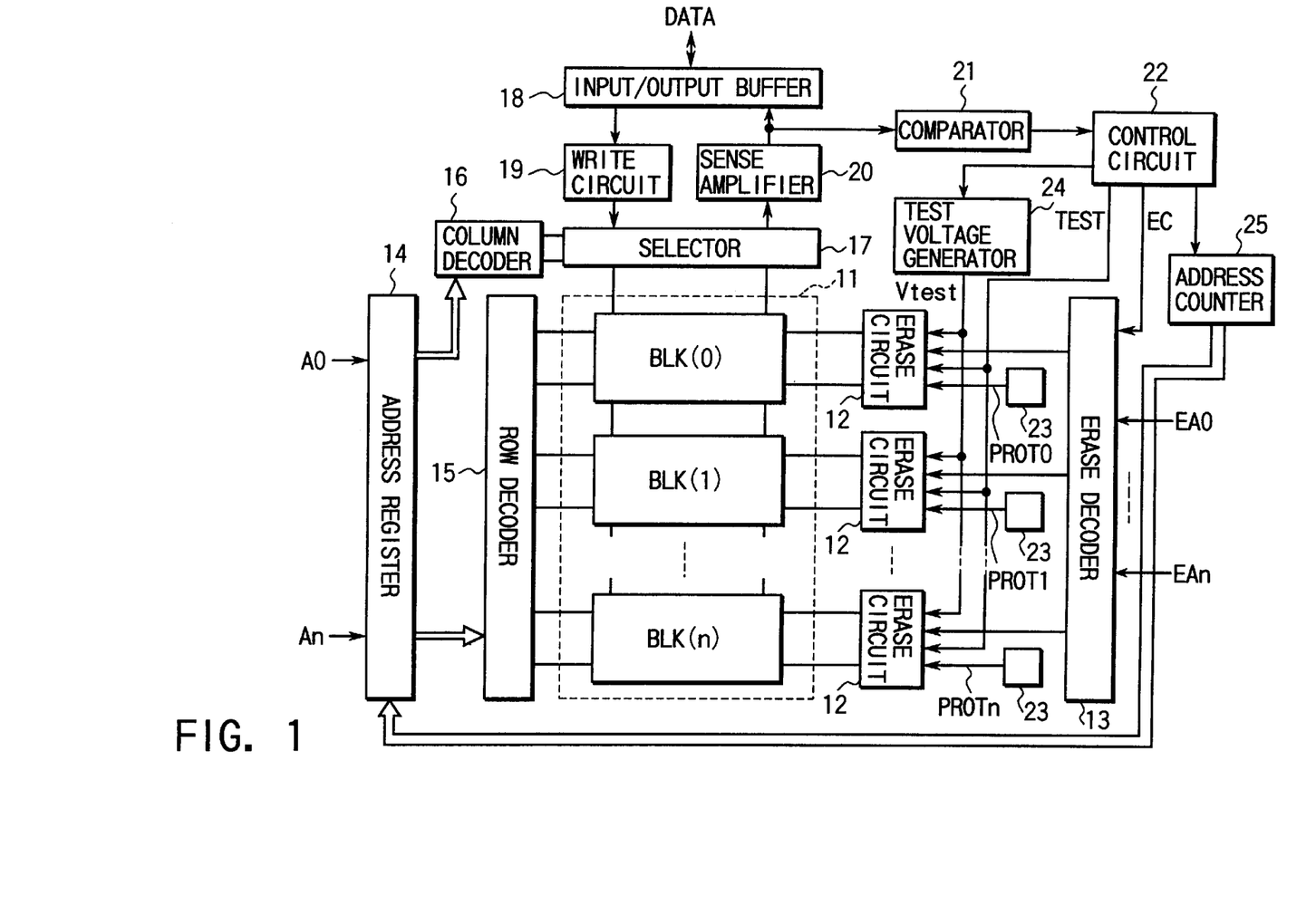
FIG. 1 is a block diagram of a nonvolatile semiconductor memory according to the present invention.

FIG. 1 shows a nonvolatile semiconductor memory which is the first embodiment of the invention.

As FIG. 1 shows, the memory cell array 11 of the memory is divided into n blocks BLK(0) to BLK(n), along lines parallel to the word lines. One erase circuit 12 is provided for each block. The erase circuit 12 is located the opposite side of row decoder 15. The memory cell array 11 is provided between the erase circuits 12 on the one hand and the row decoder 15 on the other.

An erase decoder 13 is connected to the erase circuits 12. It selects one of the n erase circuits 12 in accordance with erase address signals EA0 to EAn. It selects all erase circuits 12 to erase data in all blocks BLK(0) to BLK(n).

Address signals A0 to An are input to an address register 14. A part of each address signal is input to a row decoder 15. The other part of each address signal is input to a column decoder 16. The row decoder 15 decodes the first part of each address signal, selecting a prescribed one row (word) line of the memory cell array 11. The column decoder 16 decodes the remaining part of each address signal, generating a select signal. The select signal is supplied to a selector 17 which is located next to the bit lines of the memory cell array 11. The selector 17 selects one of the column (bit) lines in accordance with the select signal.

Data is supplied from an external device to the semiconductor memory. In the memory, the data is input to the selector 17 through an input/output buffer 18 and a write circuit 19. Hence, the data is written into selected ones of the memory cells provided in the array 11. Data read from the memory cell 11 is output through a sense amplifier 20 and the input/output buffer 18.

The data read from the memory cell array 11 is input via the sense amplifier 20 to a comparator 21.

The comparator 21 is activated when the semiconductor memory is set in the test mode. While the memory remains in the test mode, the comparator 21 determines whether or not each memory cell stores data and supplies a control circuit 22 with a signal indicating what it has determined.

The control circuit 22 is connected to a test voltage generator 24. Under the control of the circuit 22, the generator 24 applies a test voltage Vtest (e.g., about 1 to 2 V) to the erase circuits 12. Protect circuits 23 are provided, each for one erase circuit 12. The protect circuits 23 supply protect signals PROT0 to PROTn to the erase circuits 12, respectively.

The control circuit 22 generates a test signal TEST, which is supplied to the erase circuits 12. The signal TEST rises to high level when the semiconductor memory is set in the test mode.

Each erase circuit 12 applies the ground voltage VSS to the sources of the memory cells constituting the associated block while the protect signal supplied from the associated protect circuit 23 remains at high level, and applies the test voltage Vtest to the sources of these memory cells while the protect signal remains at low level. Alternatively, each erase circuit 12 may apply the test voltage Vtest to the sources of the memory cells while the protect signal remains at high level, and may apply the ground voltage VSS to the sources of these memory cells while the protect signal remains at low level.

Thus, bits of one logic value are read from the memory cells when the erase circuit 12 is set in the protect mode, and bits of the other logic value are read from the memory cells when the erase circuit 12 is not set in the protect mode. To read data from the block in this way, all memory cells must assume the same state, that is, for example, no charge is accumulated in the floating gates of the memory cells (namely, data is erased in all memory cells).

Under the control of the control circuit 22, an address counter 25 supplies internal address signals to the address register 14. The address counter 25 is used to read data items from the memory cells sequentially.

Figure 2:
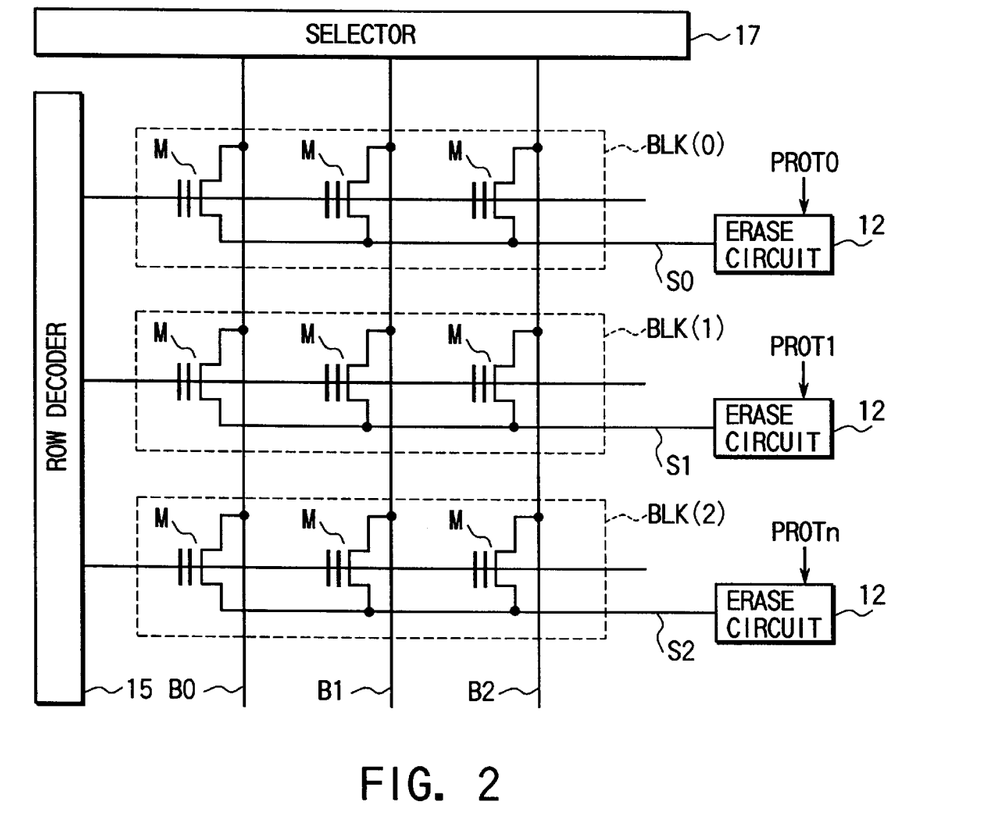
FIG. 2 is a circuit diagram showing the memory cell array incorporated in the memory of FIG. 1.

FIG. 2 shows the memory cell array 11 which is a flash memory cell array having two layers of polycrystalline silicon. As seen from FIG. 2, the array 11 comprises memory cells M, bit lines B0, B1 and B2, and source lines S0, S1 and S3. The erase circuits 12 apply the test voltage Vtest or the ground voltage VSS to the source lines S0 to S2 while the semiconductor memory is set in the test mode.

In order to write data into each memory cell M, voltages of, for example, 12V, 8V and 0V are applied to the control gate, drain and source of the cell M, respectively, thereby injecting hot electrons into the floating gate of the cell M. To erase data in each memory cell M, voltages of, for example, 0V and 12V are applied to the control gate and source of the cell M, respectively, and the drain is opened. As a result, a Fowler-Nordheim tunnel current flows between the source and the floating gate, expelling the electrons from the floating gate. To read data from each memory cell M, voltages of, for example, 5V, 0V and 1V, are applied to the control gate, source and drain of the cell M, respectively.

The erase decoder 13 and the erase circuits 12 incorporated in the memory of FIG. 1 will be described, with reference to FIG. 3.

Figure 3:
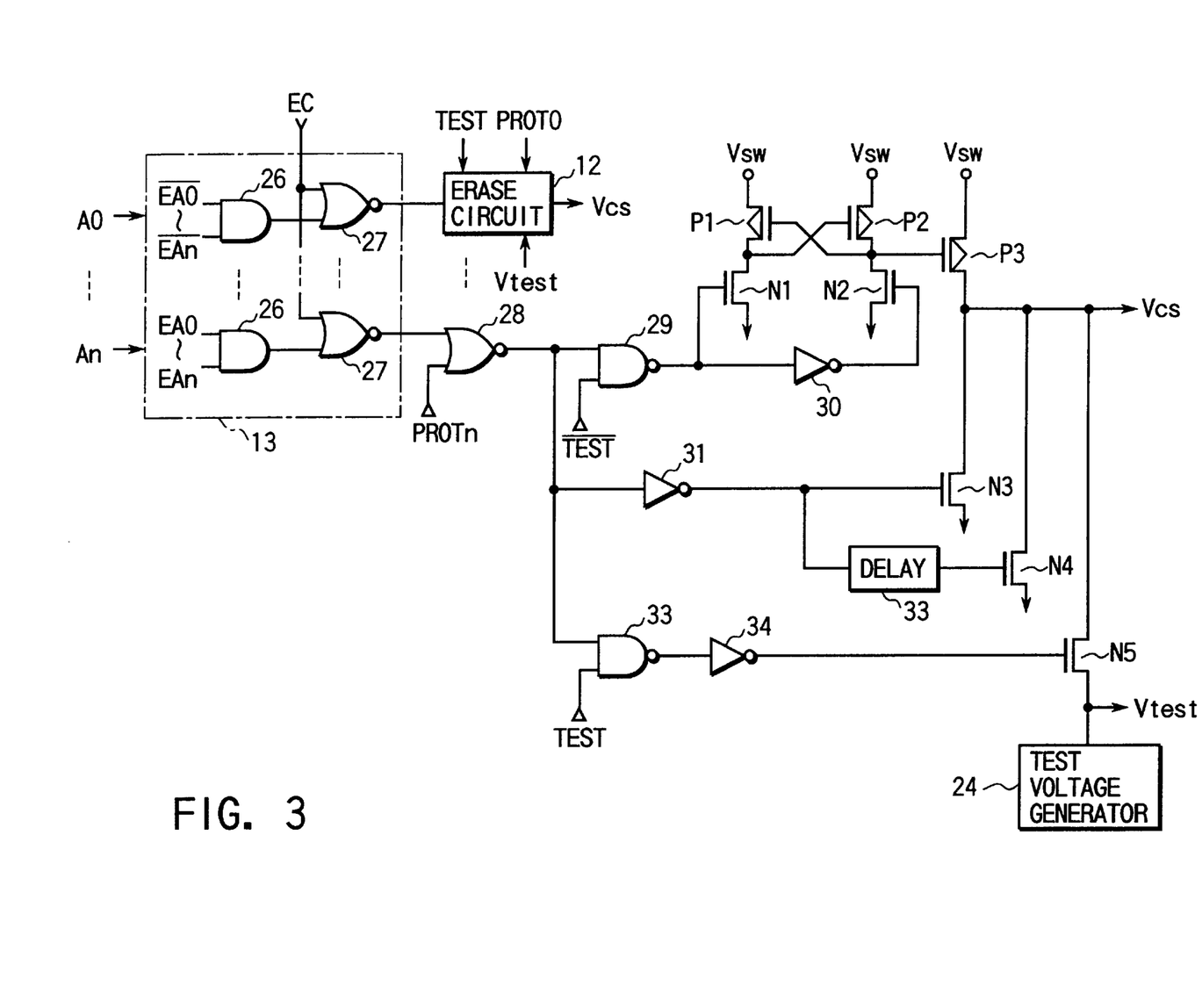
FIG. 3 is a diagram illustrating the erase decoder and one of the identical erase circuits, all incorporated in the memory of FIG. 1.

As shown in FIG. 3, the erase decoder 13 comprises n AND circuits 26 and n NOR circuits 27. Thus, one AND circuit 26 and one NOR circuit 27 are provided for each erase circuit 12. Different address signals EA0 to EAn are input to the AND circuits 26, respectively. Therefore, the output of only one of the AND circuits 26 rises to high level. The outputs of the AND circuits 26 are supplied to the NOR circuits 27, respectively. A control signal EC is supplied also to the NOR circuits 27. Hence, if the signal EC is at low level, the output of the NOR circuit 27 which receives a high-level output of the associated AND circuit 26 is at low level, while the output of any other NOR circuit 27 is at high level. If the signal EC is at high level, the outputs of all NOR circuits 27 are at low level, though different address signals EA0 to EAn are input to the AND circuits 26.

The erase circuits 12 are identical in structure. In each erase circuit 12, a NOR circuit 28 receives the output of the associated NOR circuit 27 of the erase decoder 13. The NOR circuit 28 also receives the protect signal from the associated protect circuit 23. The output of the NOR circuit 28 is input to NAND circuits 29 and 33 and a inverter 31. The test signal TEST generated by the control circuit 22 (FIG. 1) is input to the NAND circuit 33. A signal /TEST obtained by inverting the test signal TEST is input to the NAND circuit 29.

The test signal TEST is at low level while the semiconductor memory is operating normally. If the protect signal PROTn, for example, is at low level (namely, if the protect circuit 23 associated with the block BLK(n) is not set in the protect mode), data is erased in the memory cells of the block BLK(n) in accordance with the output of the erase decoder 13. If the test signal TEST and the protect signal PROTn are at low level and high level, respectively (namely, if the protect circuit 23 is set in the protect mode), data is not eased in the memory cells of the block BLK(n), regardless of the value of the output of the erase decoder 13.

As long as the semiconductor memory is set in the test mode, the test signal TEST remains at high level. If the protect signal PROTn is at low level (namely, if the protect circuit 23 is not set in the protect mode), the test voltage Vtest is applied to the sources of the memory cells provided in the block BLK(n) in accordance with the output of the erase decoder 13. Conversely, if the protect signal PROTn is at high level (namely, if the protect circuit 23 is set in the protect mode), the test ground voltage VSS is applied to the sources of the memory cells provided in the block BLK(n), irrespective of the value of output of the erase decoder 13.

The output of the NAND circuit 29 is input to the gate of an N-channel MOS transistor N1 and also to the gate of an N-channel MOS transistor N2 through an inverter 30. The N-channel MOS transistor N1 is connected in series to a P-channel MOS transistor P1. The P-channel MOS transistor N2 is connected in series to a P-channel MOS transistor P2. The gate of the MOS transistor P1 is connected to the drains of the MOS transistors P2 and N2. The gate of the MOS transistor P2 is connected to the drains of the MOS transistors P1 and N1. The gate of a P-channel MOS transistor P3 is connected to the drains of the MOS transistors P2 and N2.

The output of the inverter 31 is input to the gate of an N-channel MOS transistor N3 and also to the gate of an N-channel MOS transistor N4 through a delay circuit 32. The output of the NAND circuit 33 is input to the gate of an N-channel MOS transistor N5 through an inverter 34.

The drains of the MOS transistors P3, N3, N4 and N5 are connected to the sources of all memory cells which constitute the memory block BLK(i) to which the erase circuit 12 is connected. The sources of the MOS transistors N3 and N4 are connected to the ground. The source of the MOS transistor N5 is connected to the test voltage generator 24.

How the erase circuit 12 shown in FIG. 3 operates will be explained.

First, no charge is accumulated in the floating gate of any memory cell of the block BLK(i) to be tested. (In other words, the data is erased in all memory cells of the block BLK(i).) The test signal TEST is then set at high level.

If the data stored in the block BLK(i) is protected, the protect signal PROTi supplied to the erase circuit 12 from the protect circuit 23 is at high level. In this case, the output of the NOR circuit 28 incorporated in the erase circuit 12 is at low level. The output of the NAND circuit 29 is therefore at high level, and the MOS transistor P3 is off. The output of the inverter 31 is at high level, and the MOS transistor N3 is also on. The MOS transistor N4 is off but will be turned on upon lapse of a prescribed delay time. The output of the NAND circuit 33 is at high level, and the MOS transistor N5 is off. As a result, the ground voltage VSS is applied to the sources of the memory cells of the block BLK(i), whereby "1" bits are read from the memory cells.

If the data stored in the block BLK(i) is not protected, the protect signal PROTi supplied to the erase circuit 12 from the protect circuit 23 is at low level. In this case, the output of the NOR circuit 28 is changed in accordance with the output of the erase decoder 13. More precisely, the output of the NOR circuit 28 rises to high level since the erase decoder 13 supplies a low-level signal to only the erase circuit 12 connected to the block BLK(i). The output of the NAND circuit 33 is therefore at low level, and the MOS transistor N5 is on. The output of the NAND circuit 29 is at high level, and the MOS transistor P3 is also off. The output of the inverter 31 is at low level, and the MOS transistor N3 is off, too. The MOS transistor N4 is on but will be turned off upon lapse of the prescribed delay time. As a result, the test voltage Vtest (1V to 2V) is applied to the sources of the memory cells of the block BLK(i). The memory cells remains off, whereby "0" bits are read from the block BLK(i).

All blocks BLK(1) to BLK(n) are selected when the control signal EC supplied from the control circuit 22 to the erase decoder 13 is set at high level. When the control signal EC is set at low level, only one of the blocks BLK(1) to BLK(n) is selected in accordance with the address signals EA0 to EAn.

As described above, the test signal TEST is set at high level in the test mode, sequentially reading the data items from the memory cells of the block BLK(i). Whether the data items are "1" or "0" is examined, thereby determining whether the data stored in the block BLK(i) is reliably protected or not.

The nonvolatile semiconductor memory shown in FIG. 1 can be tested to determine whether or not the protect circuits 23 are reliably set in protect mode, merely by reading the data items from the memory cell array 11. It is not necessary to erase or write data in each of blocks of the memory cell array 11. It requires only about 0.13 sec to test each memory-cell block in the case where the block has a storage capacity of 256 kilobits and it takes 500 nsec (nanoseconds) to read one bit of data. The time required is about one tenth of the time (about 1 sec) which is spent to write or erase data in the conventional test method.

Figure 4:
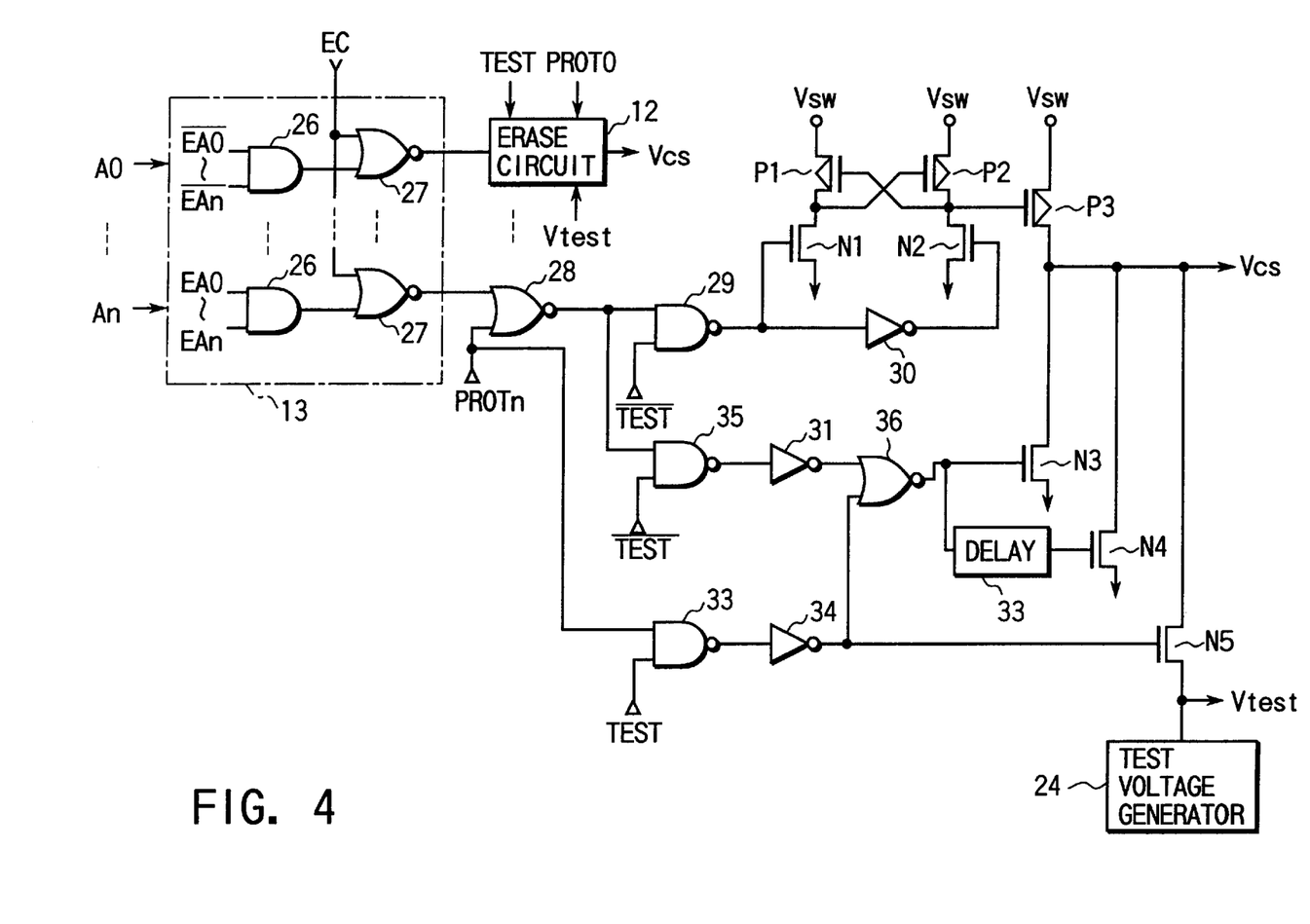
FIG. 4 is a diagram showing the erase decoder and another type of erase circuit which may be used in place of the erase circuit illustrated in FIG. 3.

The erase circuits 12 may be replaced by erase circuits of the type illustrated in FIG. 4.

As shown in FIG. 4, the erase circuit is connected to the erase decoder 13 which is identical to the one illustrated in FIG. 3. Namely, the decoder 13 comprises n AND circuits 26 and n NOR circuits 27. Thus, one AND circuit 26 and one NOR circuit 27 are provided for the erase circuit. Different address signals EA0 to EAn are input to the AND circuits 26, respectively. Therefore, the output of only one of the AND circuits 26 rises to high level. The outputs of the AND circuits 26 are supplied to the NOR circuits 27, respectively. A control signal EC is supplied also to the NOR circuits 27. Hence, if the signal EC is at low level, the output of the NOR circuit 27 which receives a high-level output of the associated AND circuit 26 is at low level, while the output of any other NOR circuit 27 is at high level. If the signal EC is at high level, the outputs of all NOR circuits 27 are at low level, though different address signals EA0 to EAn are input to the AND circuits 26.

In the erase circuit, a NOR circuit 28 receives the output of the erase detector 13, i.e., the output of the associated NOR circuit 27 thereof. The NOR circuit 28 also receives the protect signal from the associated protect circuit 23. The output of the NOR circuit 28 is input to NAND circuit 29 and a NAND circuit 31. A signal /TEST obtained by inverting the test signal TEST generated by the control circuit 22 (FIG. 1) is input to the NAND circuit 29 and the NAND circuit 31. The test signal TEST is input to an NAND circuit 33. The protect signal is supplied from the associated protect circuit 23 to the NAND circuit 33, too.

The test signal TEST is at low level while the semiconductor memory is operating normally. If the protect signal PROTn, for example, is at low level (namely, if the protect circuit 23 associated with the block BLK(n) is not set in the protect mode), data is erased in the memory cells of the block BLK(n) in accordance with the output of the erase decoder 13. If the test signal TEST and the protect signal PROTn are at low level and high level, respectively (namely, if the protect circuit 23 is set in the protect mode), data is not eased in the memory cells of the block BLK(n), regardless of the value of the output of the erase decoder 13.

As long as the semiconductor memory is set in the test mode, the test signal TEST remains at high level. If the protect signal PROTn is at low level (namely, if the protect circuit 23 is not set in the protect mode), the test ground voltage VSS is applied to the sources of the memory cells provided in the block BLK(n) in accordance with the output of the erase decoder 13. Conversely, if the protect signal PROTn is at high level (namely, if the protect circuit 23 is set in the protect mode), the test voltage Vtest is applied to the sources of the memory cells provided in the block BLK(n), irrespective of the value of output of the erase decoder 13.

The output of the NAND circuit 29 is input to the gate of an N-channel MOS transistor N1 and also to the gate of an N-channel MOS transistor N2 through an inverter 30. The N-channel MOS transistor N1 is connected in series to a P-channel MOS transistor P1. The P-channel MOS transistor N2 is connected in series to a P-channel MOS transistor P2. The gate of the MOS transistor P1 is connected to the drains of the MOS transistors P2 and N2. The gate of the MOS transistor P2 is connected to the drains of the MOS transistors P1 and N1. The gate of a P-channel MOS transistor P3 is connected to the drains of the MOS transistors P2 and N2.

The output of the NAND circuit 31 is input to the inverter 35. The output of the inverters 34, 35 is input to the NOR circuit 36. The output of the NOR circuit 36 is input to the gate of an N-channel MOS transistor N3 and also to the gate of an N-channel MOS transistor N4 through a delay line 32. The output of the NAND circuit 33 is input to the gate of an N-channel MOS transistor N5 and the NOR circuit 36 through an inverter 34.

The drains of the MOS transistors P3, N3, N4 and N5 are connected to the sources of all memory cells which constitute the memory block BLK(i) to which the erase circuit is connected. The sources of the MOS transistors N3 and N4 are connected to the ground. The source of the MOS transistor N5 is connected to the test voltage generator 24.

How the erase circuit shown in FIG. 4 operates will be explained.

First, no charge is accumulated in the floating gate of any memory cell of the block BLK(i) to be tested. (In other words, the data is erased in all memory cells of the block BLK(i).) The test signal TEST is then set at high level.

If the data stored in the block BLK(i) is protected, the protect signal PROTi supplied to the erase circuit from the protect circuit 23 is at high level. In this case, the output of the NOR circuit 28 incorporated in the erase circuit is at low level. The output of the NAND circuit 29 is therefore at high level, and the MOS transistor P3 is off. The output of the NOR circuit 31 is at low level, and the MOS transistor N3 is off, too. The MOS transistor N4 is on but will be turned off upon lapse of a prescribed delay time. The output of the NAND circuit 33 is at low level, and the MOS transistor N5 is on. As a result, the test voltage TEST is applied to the sources of the memory cells of the block BLK(i), which are off during the reading of data. Hence, "0" bits are read from the memory cells.

If the data stored in the block BLK(i) is not protected, the protect signal PROTi supplied to the erase circuit 12 from the protect circuit 23 is at low level. In this case, the output of the NOR circuit 28 is changed in accordance with the output of the erase decoder 13. To be specific, the output of the NOR circuit 28 rises to high level since the erase decoder 13 supplies a low-level signal to only the erase circuit which is connected to the block BLK(i). The output of the NAND circuit 33 is therefore at high level, and the MOS transistor N5 is off. The output of the NAND circuit 29 is at high level, and the MOS transistor P3 is also off. The output of the NOR circuit 36 is at high level, and the MOS transistor N3 is on. The MOS transistor N4 is on but will be turned on upon lapse of the prescribed delay time. As a result, the ground voltage VSS is applied to the sources of the memory cells of the block BLK(i). The memory cells remains on, whereby "1" bits are read from the block BLK(i).

All blocks BLK(1) to BLK(n) are selected when the control signal EC supplied from the control circuit 22 to the erase decoder 13 is set at high level. When the control signal EC is set at low level, only one of the blocks BLK(1) to BLK(n) is selected in accordance with the address signals EA0 to EAn.

As described above, the test signal TEST is set at high level in the test mode, sequentially reading the data items from the memory cells of the block BLK(i).

Whether the data items are "1" or "0" is examined, thereby determining whether the data stored in the block BLK(i) is reliably protected or not.

Like the circuit of FIG. 3, the circuit shown in FIG. 4 makes it possible to test the nonvolatile semiconductor memory (FIG. 1) to determine whether or not the protect circuits 23 are reliably set in protect mode, merely by reading the data items from the memory cell array 11. It is not necessary to erase or write data in each of blocks of the memory cell array 11. It requires only about 0.13 sec to test each memory-cell block in the case where the block has a storage capacity of 256 kilobits and it takes 500 nsec to read one bit of data. The time required is about one tenth of the time (about 1 sec) which is spent to write or erase data in the conventional test method.

Figure 5:
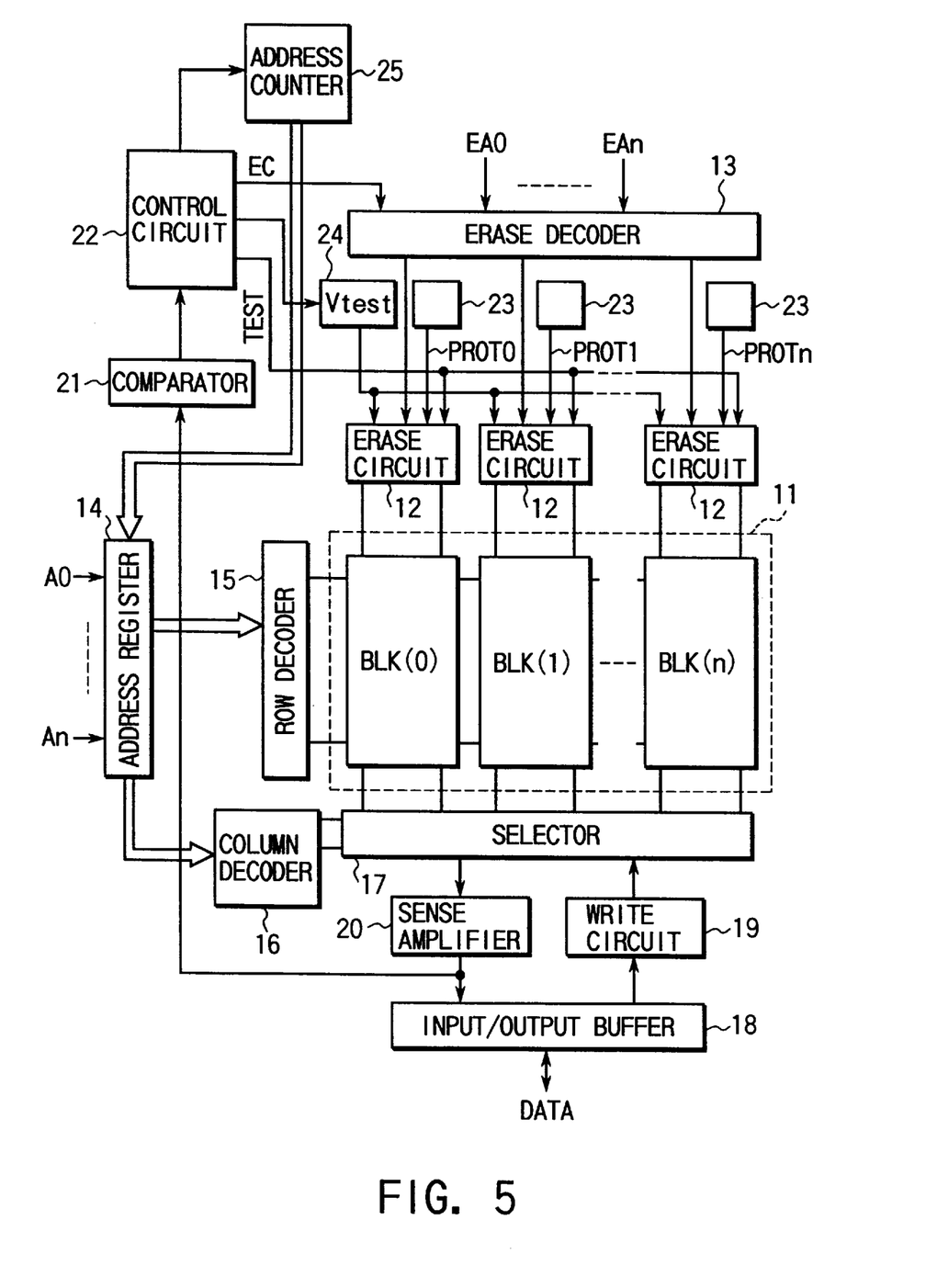
FIG. 5 is a block diagram showing another type of a nonvolatile semiconductor memory according to this invention.

FIG. 5 shows another type of a nonvolatile semiconductor memory according to the present invention. This memory differs from the memory of FIG. 1 in that the memory cell array 11 is divided into a plurality of blocks, along lines extending parallel to the bit lines or the source lines.

More precisely, the memory cell array 11 of this memory is divided into n blocks BLK(0) to BLK(n) as is illustrated in FIG. 5. One erase circuit 12 is provided for each block. The erase circuit 12 is connected to the source lines of the associated block.

An erase decoder 13 is connected to the erase circuits 12. It selects one of the n erase circuits 12 in accordance with erase address signals EA0 to EAn. It selects all erase circuits 12 to erase data in all blocks BLK(0) to BLK(n).

Address signals A0 to An are input to an address register 14. A part of each address signal is input to a row decoder 15. The other part of each address signal is input to a column decoder 16. The row decoder 15 decodes the first part of each address signal, selecting a prescribed one row (word) line of the memory cell array 11. The column decoder 16 decodes the remaining part of each address signal, generating a select signal. The select signal is supplied to a selector 17 which is connected to the column (bit) lines of the memory cell array 11. The selector 17 selects one of the column (bit) lines in accordance with the select signal. The memory cell array 11 is provided between the erase circuits 12 on the one hand and the selector 17 on the other.

Data is supplied from an external device to the semiconductor memory. In the memory, the data is input to the selector 17 through an input/output buffer 18 and a write circuit 19. Hence, the data is written into selected ones of the memory cells provided in the array 11. Data read from the memory cell array 11 is output through a sense amplifier 20 and the input/output buffer 18.

The data read from the memory cell array 11 is input via the sense amplifier 20 to a comparator 21. The comparator 21 is activated when the semiconductor memory is set in the test mode. While the memory remains in the test mode, the comparator 21 determines whether or not each memory cell stores data and supplies a control circuit 22 with a signal indicating what it has determined.

The control circuit 22 is connected to a test voltage generator 24. Under the control of the circuit 22, the generator 24 applies a test voltage Vtest (e.g., about 1 to 2 V) to the erase circuits 12. Protect circuits 23 are provided, each for one erase circuit 12. The protect circuits 23 supply protect signals PROT0 to PROTn to the erase circuits 12, respectively.

The control circuit 22 generates a test signal TEST, which is supplied to the erase circuits 12. The signal TEST rises to high level when the semiconductor memory is set in the test mode.

Each erase circuit 12 applies the test voltage Vtest to the sources of the memory cells constituting the associated block while the protect signal supplied from the associated protect circuit 23 remains at high level, and applies the ground voltage VSS to the sources of these memory cells while the protect signal remains at low level. Alternatively, each erase circuit 12 may apply the ground voltage VSS to the sources of the memory cells while the protect signal remains at high level, and may apply the test voltage Vtest to the sources of these memory cells while the protect signal remains at low level.

Under the control of the control circuit 22, an address counter 25 supplies internal address signals to the address register 14. The address counter 25 is used to read data items from the memory cells sequentially.

Figure 6:
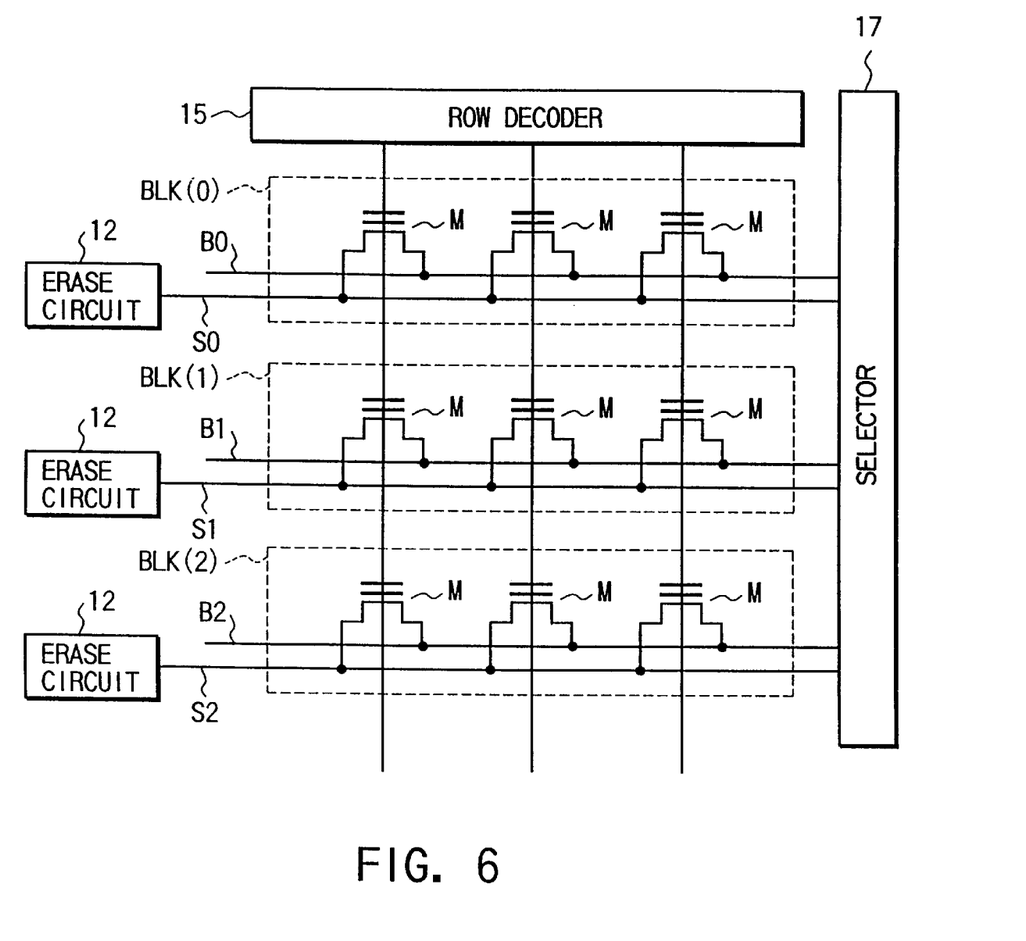
FIG. 6 is a circuit diagram showing the memory cell array incorporated in the memory of FIG. 5.

FIG. 6 shows the memory cell array 11 which is a flash memory cell array having two layers of polycrystalline silicon. As shown in FIG. 6, the array 11 comprises memory cells M, bit lines B0, B1 and B2, and source lines S0, S1 and S3. The erase circuits 12 apply the test voltage Vtest or the ground voltage VSS to the source lines S0 to S2 while the semiconductor memory is set in the test mode.

In order to write data into each memory cell M, voltages of, for example, 12V, 8V and 0V are applied to the control gate, drain and source of the cell M, respectively, thereby injecting hot electrons into the floating gate of the cell M. To erase data in each memory cell M, voltages of, for example, 0V and 12V are applied to the control gate and source of the cell M, respectively, and the drain is opened. As a result, a Fowler-Nordheim tunnel current flows between the source and the floating gate, expelling the electrons from the floating gate. To read data from each memory cell M, voltages of, for example, 5V, 0V and 1V are applied to the control gate, source and drain of the cell M, respectively.

The erase decoder 13 and the erase circuits 12 incorporated in the memory of FIG. 5 are those show in FIG. 3 or those shown in FIG. 4. The nonvolatile semiconductor memory of FIG. 5 operates exactly in the same way as the memory illustrated in FIG. 1.

Like the memory of FIG. 1, the memory shown in FIG. 5 can be tested to determine whether or not the protect circuits 23 are reliably set in protect mode, merely by reading the data items from the memory cell array 11. It is unnecessary to erase or write data in each of blocks of the memory cell array in order to determine whether the protect circuits 23 are set in protect mode or not. Hence, whether or not the circuits 23 are set in protect mode can be determined in a short time. This helps to decrease the manufacturing cost of the nonvolatile semiconductor memory.

As has been described, the nonvolatile semiconductor memories according to the present invention are advantageous in the following respects.

In the test mode, all memory cells of any block to be examined are set in the same state (for example, no charge accumulated in the floating gates of the cells, thus erasing data in the cells). The erase circuit connected to the block then applies a first voltage to the sources of the memory cells while the erase circuit connected to the block is set in the protect mode and a second voltage thereto while the erase circuit is not set in the protect mode. Bits of one logic value (e.g., "1") are read from the memory cells when the erase circuit is set in the protect mode, and bits of the other logic value (e.g., "0") are read from the memory cells when the erase circuit is not set in the protect mode. Therefore, whether the protect circuit connected to the block is set in protect mode or not can be determined by activating the test signal TEST, thereby reading data from the memory cells, and by detecting which bits, "1" bits or "0" bits, are read from the memory cells.

In summary, the nonvolatile semiconductor memories of this invention can be tested to determine whether or not the protect circuits are reliably set in protect mode, merely by reading the data items from the memory cell array, not by erasing or writing data in each of blocks of the memory cell. Hence, whether or not the circuits are set in protect mode can be determined in a short time. This serves to reduce the manufacturing cost of the memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A nonvolatile semiconductor memory comprising:
   a memory cell array having a plurality of memory cells each of which has a source;
   a protect circuit for generating a protect signal representing whether data stored in the memory cells is protected;
   data-reading means for reading the data from the memory cells; and
   test means for determining whether the data stored in the memory cells is protected, from the protect signal, while the memory remains in a test mode, and changing a voltage applied to the sources of the memory cells, thereby altering data to be read from the memory cells in accordance with whether the data stored in the memory cells is protected.

2. The nonvolatile semiconductor memory according to claim 1, further comprising:
   an erase circuit for applying an erase voltage to the sources of the memory cells, thereby erasing the data stored in the memory cells, while the memory remains in an erase mode; and a control circuit for generating a test signal, thereby switching an operating mode between the test mode and the erase mode.

3. The nonvolatile circuit memory according to claim 1, wherein data is erased in the memory cells when the memory is set in the test mode.

4. A nonvolatile semiconductor memory comprising:

a memory cell array having word lines, bit lines and source lines and divided into a plurality of blocks each having a plurality of memory cells;

a plurality of protect circuits, each provided for one block and designed to generate a protect signal representing whether data stored in the memory cells is protected;

data-reading means for reading the data from the memory cells of each block; and test means for determining whether the data stored in the memory cells of each block is protected, from the protect signal, while the memory remains in a test mode, and changing a voltage applied to the sources of the memory cells of each block, thereby altering data to be read from the memory cells of each block in accordance with whether the data stored in the memory cells is protected.

5. The nonvolatile semiconductor memory according to claim 4, further comprising:

a plurality of erase circuits, each provided for one block and designed to apply an erase voltage to the sources of the memory cells of the block, thereby erasing the data stored in the memory cells of the block, while the memory remains in an erase mode; and a control circuit for generating a test signal, thereby switching an operating mode between the test mode and the erase mode.

6. The nonvolatile semiconductor memory according to claim 4, said memory cell array is divided into a plurality of blocks, along lines extending parallel to the word lines.

7. The nonvolatile semiconductor memory according to claim 4, said memory cell array is divided into a plurality of blocks, along lines extending parallel to the bit lines or the source lines.

8. The nonvolatile semiconductor memory according to claim 4, wherein data is erased in the memory cells when the memory is set in the test mode.

9. A nonvolatile semiconductor memory comprising:

a memory cell array having a plurality of memory cells each of which has a source;

a protect circuit for generating a protect signal representing whether the memory cells are in a protect state;

a sense amplifier connected to the memory cells, for amplifying data read from the memory cells;

a control circuit for generating a test signal indicative of a test mode;

a test voltage generator for generating a test voltage; and an erase circuit connected to the protect circuit, the control circuit and the test voltage generator, the erase circuit determining a voltage applied to the sources of the memory cells in accordance with the protect signal and the test signal;

wherein said erase circuit applies a first voltage to the sources of the memory cells in a test mode while the memory cells remain in the protect state, and said erase circuit applies a second voltage to the sources of the memory cells in the test mode while the memory cells remain in an unprotect state, and a data read operation is subsequently performed on one or more of said memory cells.

10. The nonvolatile semiconductor memory according to claim 9, wherein during said data read operation, data having a first value irrespective of the data stored in said memory cells is input to the sense amplifier when said erase circuit has applied said first voltage to the sources of the memory cells; and data having a second value corresponding to the data stored in said memory cells is input to the sense amplifier when said erase circuit has applied said second voltage to the sources of the memory cells.

11. The nonvolatile semiconductor memory according to claim 10, wherein the first voltage is a positive voltage and the second voltage is a ground voltage.

12. The nonvolatile semiconductor memory according to claim 10, wherein the data stored in the memory cells is erased in the test mode, and the data provided to the sense amplifier during said read operation is different from the data stored in the memory cells when said erase circuit applies the first voltage to the sources of the memory cells in the test mode.

13. The nonvolatile semiconductor memory according to claim 12, wherein a write data having the first value is input to said sense amplifier during said read operation if the memory cells are in the protect state in the test mode, and an erase data having a second value is input to said sense amplifier during said read operation if the memory cells are in the unprotect state in the test mode.

14. The nonvolatile semiconductor memory according to claim 9, wherein the data stored in the memory cells is input to the sense amplifier during said read operation if said erase circuit has applied the first voltage to the sources of the memory cells in the test mode, and data having a first value is input to the sense amplifier irrespective of the data stored in the memory cells when said erase circuit has applied the second voltage to the sources of the memory cells in the test mode.

15. The nonvolatile semiconductor memory according to claim 14, wherein the first voltage is a ground voltage and the second voltage is a positive voltage.

16. The nonvolatile semiconductor memory according to claim 14, wherein the data stored in the memory cells is erased in the test mode, and the data provided to the sense amplifier during said read operation is different from the data stored in the memory cells if said erase circuit has applied the second voltage to the sources of the memory cells in the test mode.

17. The nonvolatile semiconductor memory according to claim 16, wherein an erase data having a second value is input to said sense amplifier during the read operation if the memory cells are in the protect state in the test mode, and a write data having the first value is input to said sense amplifier if the memory cells are in the unprotect state in the test mode.

18. The nonvolatile semiconductor memory according to claim 9, wherein said erase circuit applies an erase voltage to the sources of the memory cells in an erase mode, and said control circuit selects one of the test mode and the erase mode.

19. A nonvolatile semiconductor memory comprising:

a memory cell array having word lines, bit lines and source lines, where said memory cell array is divided into a plurality of blocks each having a plurality of memory cells;

a protect circuit designed to generate a protect signal representing whether the memory cells in a corresponding one of said blocks are in a protect state;

a sense amplifier connected to the memory cells of each block and for amplifying data read from the memory cells of each block;

a control circuit for generating a test signal;

a test voltage generator for generating a test voltage; and an erase circuit, connected to the protect circuit, the control circuit and the test voltage generator, determining a voltage applied to the source of the memory cells in said corresponding one of said blocks in accordance with the protect signal and the test signal;

wherein a data read operation is performed in a test mode, and said erase circuit applies a first voltage to the sources of the memory cells of the corresponding one of said blocks in a test mode if the memory cells of the corresponding block are in the protect state, and a second voltage to the sources of the memory cells of the corresponding one of said blocks in the test mode if the memory cells of the corresponding one of said blocks are in an unprotect state.

20. The nonvolatile semiconductor memory according to claim 19, wherein during said read operation, data having a first value is input to the sense amplifier irrespective of the data stored in the memory cells of the corresponding one of said blocks when said erase circuit applies the first voltage to the sources of the memory cells of the corresponding one of said blocks in the test mode, and the data stored in the memory cells of the corresponding one of said blocks is input to the sense amplifier when said erase circuit applies the second voltage to the sources of the memory cells of the corresponding one of said blocks in the test diode.

21. The nonvolatile semiconductor memory according to claim 20, wherein the first voltage is a positive voltage and the second voltage is a ground voltage.

22. The nonvolatile semiconductor memory according to claim 20, wherein the data stored in the memory cells of each block is erased in the test mode, and the data provided to the sense amplifier during said read operation is different from the data stored in the memory cells of the corresponding one of said blocks when said erase circuit applies the first voltage to the sources of the memory cells of the corresponding one of said blocks in the test mode.

23. The nonvolatile semiconductor memory according to claim 22, wherein a write data having the first value is input to said sense amplifier during said read operation if the memory cells of the corresponding one of said blocks are in the protect state in the test mode, and an erase data having a second value is input to said sense amplifier during the read operation if the memory cells of the corresponding one of said blocks are in the unprotect state in the test mode.

24. The nonvolatile semiconductor memory according to claim 19, wherein data stored in the memory cells of the corresponding one of said blocks is input to the sense amplifier during the read operation irrespective of the data stored in the memory cells of the corresponding one of said blocks when said erase circuit applies the first voltage to the sources of the memory cells of the corresponding one of said blocks in the test mode, and data having a first value is input to the sense amplifier during said read operation when said erase circuit applies the second voltage to the sources of the memory cells of the corresponding one of said blocks in the test mode.

25. The nonvolatile semiconductor memory according to claim 24, wherein the first voltage is a ground voltage and the second voltage is a positive voltage.

26. The nonvolatile semiconductor memory according to claim 24, wherein the data stored in the memory cells of each block is erased in the test mode, and the data provided to the sense amplifier during said read operation is different from the data stored in the memory cells of the corresponding one of sad blocks when said erase circuit applies the second voltage to the sources of the memory cells of the corresponding one of said blocks in the test mode.

27. The nonvolatile semiconductor memory according to claim 26, wherein an erase data having a second value is input to said sense amplifier during the read operation if the memory cells of the corresponding one of said blocks are in the protect state in the test mode, and a write data having the first value is input to said sense amplifier during said read operation if the memory cells of the corresponding one of said blocks are in the unprotect state in the test mode.

28. The nonvolatile semiconductor memory according to claim 17, wherein said erase circuit applies an erase voltage to the sources of the memory cells of the corresponding one of said blocks in an erase mode, and said control circuit selects one of the test mode and the erase mode.

29. A nonvolatile semiconductor memory comprising:

a memory cell array having a plurality of memory cells each of which has a source;

a protect circuit for generating a protect signal representing whether the memory cells are in a protect state;

a sense amplifier connected to the memory cells and for amplifying the data read from the memory cells;

a control circuit for generating a test signal;

a test voltage generator for generating a test voltage; and an erase circuit connected to the protect circuit, the control circuit and the test voltage generator, configured to determine a voltage applied to the memory cells in accordance with the protect signal and the test signal;

wherein said erase circuit applies a first voltage to the memory cells in a test mode while the memory cells remain in the protect state, and said erase circuit applies a second voltage to the memory cells in the test mode while the memory cells remain in an unprotect state, and a data read operation is performed in the test mode.

30. The nonvolatile semiconductor memory according to claim 29, wherein said erase circuit applies an erase voltage to the memory cells in an erase mode and said control circuit selects one of the test mode and the erase mode.

31. The nonvolatile semiconductor memory according to claim 29, wherein a first data is input to said sense amplifier during said read operation if the memory cells are in the protect state, and a second data is input to said sense amplifier during the read operation if the memory cells are in the unprotect state.

32. The nonvolatile semiconductor memory according to claim 20, wherein the first data is different from the second data.

33. A nonvolatile semiconductor memory comprising:

a memory cell array having word lines, bit lines and source lines and divided into a plurality of blocks each having a plurality of memory cells;

a plurality of protect circuits, each provided for a corresponding one of said blocks and designed to generate a protect signal representing whether the memory cells in said corresponding block are in a protect state;

a sense amplifier connected to the memory cells of each block and for amplifying data read from the memory cells of each block;

a control circuit for generating a test signal;

a test voltage generator for generating a test voltage; and a plurality of erase circuits, each provided for a corresponding one of said blocks, and each connected to one of the protect circuits, the control circuit and the test voltage generator, configured to determine a voltage applied to the memory cells in accordance with the protect signal and the test signal;

wherein each of said erase circuits applies a first voltage to the memory cells in a test mode while the memory cells of the corresponding one of said blocks are in the protect state, and each of said erase circuits applies a second voltage to the memory cells of the corresponding one of said blocks in the test mode while the memory cells of the corresponding one of said blocks are in an unprotect state, and a data read operation is performed in the test mode.

34. The nonvolatile semiconductor memory according to claim 33, wherein each of said erase circuits applies an erase voltage to the memory cells of the corresponding one of said blocks in an erase mode, and said control circuit selects one of the test mode and the erase mode.

35. The nonvolatile semiconductor memory according to claim 33, wherein a first data is input to said sense amplifier during said read operation if the memory cells being read are in the protect state, and a second data is input to said sense amplifier during said read operation if the memory cells being read are in the unprotect state.

36. The nonvolatile semiconductor memory according to claim 35, wherein the first data is different from the second data.

37. A nonvolatile semiconductor memory comprising:

a memory cell array having a plurality of memory cells each of which has a source;

a protect circuit for generating a protect signal representing whether the memory cells are a protect state;

a sense amplifier connected to the memory cells, for amplifying data read from the memory cells;

a control circuit for generating a test signal;

a test voltage generator for generating a test voltage; and an erase circuit connected to the protect circuit, the control circuit and the test voltage generator, configured to determine a voltage applied to the sources of the memory cells in accordance with the protect signal and the test signal;

wherein, in a test mode for testing a protect function of said protect circuit, said erase circuit applies a first voltage to the sources of the memory cells to test the protect function based on the data input to said sense amplifier while the memory cells remain in the protect state, and said erase circuit applies a second voltage to the sources of the memory cells to test the protect function based on the data input to said sense amplifier while the memory cells remain in an unprotect state.

38. A nonvolatile semiconductor memory comprising:

a memory cell array having a plurality of memory cells each of which has a source;

a protect circuit for generating a protect signal representing whether the memory cells are in a protect state;

a sense amplifier connected to the memory cells and for amplifying the data read from the memory cells;

a control circuit for generating a test signal indicative of a test mode for testing the protect function of said protect circuit;

a test voltage generator for generating a test voltage; and an erase circuit connected to the protect circuit, the control circuit and the test voltage generator, and determining a voltage applied to the memory cells in accordance with the protect signal and the test signal;

wherein in said test mode a data read operation is performed, and said erase circuit applies a first voltage to the memory cells if the memory cells are in the protect state, and a second voltage to the memory cells if the memory cells are in an unprotect state;

wherein said erase circuit applies said first voltage to test the protect function based on the data input to said sense amplifier while the memory cells remain in the protect state, and said erase circuit applies a second voltage to the memory cells to test the protect function based on the data input to said sense amplifier while the memory cells remain in an unprotect state.

* * * * *